(12) United States Patent
Sinn et al.

(10) Patent No.: US 10,992,296 B2
(45) Date of Patent: Apr. 27, 2021

(54) CIRCUIT ARRANGEMENT FOR THE TEMPERATURE-DEPENDENT ACTUATION OF A SWITCHING ELEMENT

(71) Applicant: Robert Bosch GmbH, Stuttgart (DE)

(72) Inventors: Peter Sinn, Untergruppenbach (DE); Timo Bartsch, Heimsheim (DE)

(73) Assignee: Robert Bosch GmbH, Stuttgart (DE)

( * ) Notice: Subject to any disclaimer, the term of this patent is extended or adjusted under 35 U.S.C. 154(b) by 428 days.

(21) Appl. No.: 15/779,719

(22) PCT Filed: Nov. 22, 2016

(86) PCT No.: PCT/EP2016/078365
§ 371 (c)(1),
(2) Date: May 29, 2018

(87) PCT Pub. No.: WO2017/089321
PCT Pub. Date: Jun. 1, 2017

(65) Prior Publication Data
US 2020/0304121 A1    Sep. 24, 2020

(30) Foreign Application Priority Data
Nov. 26, 2015 (DE) ................ DE10 2015 223 465.7

(51) Int. Cl.
*H03K 17/74* (2006.01)
*H03K 17/16* (2006.01)
(52) U.S. Cl.
CPC .......... *H03K 17/74* (2013.01); *H03K 17/163* (2013.01)

(58) Field of Classification Search
CPC .... H03K 17/16; H03K 17/161; H03K 17/162; H03K 17/163; H03K 17/51; H03K 17/74
See application file for complete search history.

(56) References Cited

U.S. PATENT DOCUMENTS 5,986,484 A    11/1999  Kimata
2015/0123715 A1*  5/2015  Butow .................. H03K 17/16
                                                        327/109

FOREIGN PATENT DOCUMENTS

| DE | 19913465   | 9/2000  |
| DE | 102009015322 | 10/2009 |
| DE | 102010043109 | 5/2012  |
| EP | 2871776    | 5/2015  |

OTHER PUBLICATIONS

International Search Report for Application No. PCT/EP2016/078365 dated Mar. 8, 2017 (English Translation, 3 pages).

* cited by examiner

*Primary Examiner* — Diana J. Cheng
(74) *Attorney, Agent, or Firm* — Michael Best & Friedrich LLP

(57) ABSTRACT

The invention relates to a circuit arrangement (100) for the temperature-dependent actuation of a first switching element (S1), comprising an input terminal (EA) for accepting an input potential, an output terminal (AA) for transferring an output potential to a first control terminal (G1) of the first switching element (S1), and a temperature-dependent component (RT) which is connected between the input terminal (EA) and the output terminal (AA).

9 Claims, 4 Drawing Sheets

CIRCUIT ARRANGEMENT FOR THE TEMPERATURE-DEPENDENT ACTUATION OF A SWITCHING ELEMENT

BACKGROUND OF THE INVENTION

The invention relates to a circuit arrangement for the temperature-dependent actuation of a first switching element. The invention further relates to a circuit module, an inverter and the use of the circuit arrangement.

Switching elements, in particular power semiconductor switches, such as bipolar transistors, IGBTs, MOSFETs, are actuated using a driver circuit. In this case, in order to close the switching element, a prescribable, fixed voltage potential is applied to the control connection of the semiconductor, to the gate. The switching speed of the switching element can be set by a series resistor, which is arranged between the actuation circuit and the control connection of the semiconductor. The higher the series resistance, the slower and less prone to losses the switching process. However, the temperature-dependent switching behavior of a semiconductor cannot be taken into account by means of said series resistor. It is known that the switching losses generally increase as the temperature of the semiconductor increases. To minimize the switching losses, the switching speed of the switching element would have to be reduced as the temperature increases. To this end, a lower series resistance would have to be used. However, when the temperature decreases again, for example at room temperature, very fast switching edges would then occur on account of the low series resistance. These fast switching edges lead to electromagnetic interference and to overvoltages, which can damage the semiconductor.

DE 199 13 465 discloses a circuit arrangement for the actuation of a power transistor, which is actuated by means of a push-pull stage. Different series resistors are provided for switching the power transistor on and off in order to set a desired switch-on and switch-off of the semiconductor.

There is the need to improve such actuation operations such that a desired switching behavior is made possible even at different temperatures.

SUMMARY OF THE INVENTION

A circuit arrangement for the temperature-dependent actuation of a first switching element is provided. Said circuit arrangement comprises an input connection for receiving an input potential, an output connection for transferring an output potential to a first control connection of the first switching element, and a temperature-dependent component. The temperature-dependent component is connected between the input connection and the output connection.

A circuit arrangement in which an input potential or an input control voltage is applied on the input side is thus provided. An output potential or an output control voltage at the first control connection of the first switching element is applied on the output side depending on the input control voltage. A temperature-dependent component is further arranged between the driver circuit and the control connection of the first switching element, in particular of a semiconductor switch. A temperature-dependent component can be embodied in a variety of ways, for example as a circuit composed of operational amplifiers, which are actuated in a temperature-dependent manner. A processor-controlled circuit, in which a temperature sensor is read out, or a temperature-dependent resistor is also considered as a temperature-dependent component in this context. A temperature-dependent resistor, for example, can have a positive or a negative temperature coefficient. In a temperature-dependent resistor having a negative temperature coefficient (NTC), the value of the resistance decreases as the temperature increases; in a temperature-dependent resistor having a positive temperature coefficient (PTC), the value of the resistance increases as the temperature increases. One suggestion is therefore for a temperature-dependent resistor having a negative temperature coefficient (NTC) to be arranged between a driver circuit and the control connection of the semiconductor. An increase in the switching losses and deceleration of the switching behavior of the switching element can therefore be prevented despite increasing temperatures. Even in the case of a series circuit or parallel circuit, which could be arranged between a driver circuit and the control connection of the semiconductor and could consist of a series resistor and a temperature-dependent resistor, the total series resistance resulting therefrom decreases as the temperature increases. In a series circuit composed of a temperature-dependent resistor and a series resistor, the resistance value of the series resistor prescribes the lowest value of the resulting total series resistance of the arrangement. Particularly in the case of high actuation currents and high clock frequencies, there is the danger of the inherent heating of the temperature-dependent resistor taking place faster than the heating of the semiconductor itself. It is therefore possible for operating points, at which the temperature-dependent resistor is already hot and consequently still only has a very low resistance value, to arise even though the switching element itself has not yet heated up. The resulting operation of the switching element at a comparatively insufficient series resistance can lead to harmful overvoltages and electromagnetic interference.

In another configuration of the invention, the circuit arrangement further comprises a second switching element and a first resistor. The first resistor is connected in series with the temperature-dependent component. Said series circuit is connected between the input connection and the output connection. The second switching element is likewise connected between the input connection and the output connection, in particular in parallel with the series circuit. The second switching element has a second control connection, which is connected to the center tap between the first resistor and the temperature-dependent component.

Providing a second switching element, which is arranged between the input and the output connection and the control connection of which is connected to the center tap between a first resistor and the temperature-dependent component, makes it possible to connect and disconnect a further current path between the input and the output connection. The first resistor, which is connected in series with the temperature-dependent component between the input connection and the output connection, acts together with the temperature-dependent resistor as a voltage divider. The dimensioning of this voltage divider sets the control of the second switching element. The temperature at which the second switching element is actuated and the further current path is conductively connected between the input connection and the output connection to actuate the first switching element can be set by means of the magnitude of the first resistance in connection with the temperature-dependent resistor. When the further current path is conducting, a lower total series resistance acts in the actuation path of the first switching element. An option for setting or prescribing the temperature at which the second switching element switches over is advantageously created by means of providing the first resistor. A further current path between the input and output connection is therefore advantageously provided, said further current path being connected and disconnected depending on the control voltage at the second control connection of the second switching element and therefore making it possible to significantly change, that is to say to decrease or increase, the effective total series resistance of the first control connection, in particular in a temperature-dependent manner.

In another configuration of the invention, there is provision for the circuit arrangement to further comprise a second resistor, wherein the second resistor is connected between the input connection and the output connection, in particular is connected in parallel with the current path by the second switching element and with the series circuit.

The circuit arrangement comprises a second resistor, which acts in a substantially temperature-dependent manner as a series resistor of the control connection of the first switching element. The switching behavior of the first switching element can advantageously be fundamentally set by means of suitable dimensioning of said series resistor. The second resistor is dimensioned in such a way that harmful overvoltages and interfering electromagnetic emissions are prevented during operation of the first switching element.

In another configuration of the invention, there is provision for the circuit arrangement to further comprise a third resistor. The third resistor is arranged between the input connection and the second switching element.

The third resistor, which is connected between the input connection and the second switching element, determines the effective resistance of the further current path between the input and the output connection when the second switching element is closed. Particularly at relatively high temperatures, when the temperature-dependent resistor has a low value, the second switching element closes and a flow of current through the further current path, that is to say through the third resistor and the second switching element to the output connection, becomes possible. The effective total series resistance between the input and output connection is reduced in the process. The effective total series resistance is substantially produced here from the parallel circuit of the second and the third resistor when the temperature-dependent resistor is of high-impedance. An option for reducing the effective resistance between the input and output connection to a prescribable lower value in a temperature-dependent manner is advantageously created.

In another configuration of the invention, the circuit arrangement comprises a first diode. Said first diode is connected between the third resistor and the second switching element. The diode is oriented in such a way that a flow of current from the second switching element in the direction of the third resistor is prevented.

A first diode, which prevents a flow of current from the second switching element in the direction of the third resistor, is connected between the second switching element and the third resistor. An undesired flow of current through the body diode of the second switching element, in particular of an n-channel MOSFET, is thus advantageously prevented. This configuration of the circuit arrangement is particularly suitable for switching on the first switching element.

In another configuration of the invention, said first diode is oriented in such a way that a flow of current from the third resistor in the direction of the second switching element is prevented.

A first diode, which prevents a flow of current from the third resistor in the direction of the second switching element, is connected between the second switching element and the third resistor. An undesired flow of current through the body diode of the second switching element, in particular of a p-channel MOSFET, is thus advantageously prevented. This configuration of the circuit arrangement is particularly suitable for switching off the first switching element.

Furthermore, a circuit module is provided, which comprises a described circuit arrangement for the temperature-dependent actuation of a first switching element and comprises the first switching element connected to the output connection. A circuit module having a switching element and a temperature-dependent actuation system is thus advantageously provided.

In another configuration of the invention, the circuit module further comprises a driver circuit connected to the input connection. A circuit module having a temperature-dependent actuation system, a first switching element and a driver circuit is advantageously provided.

Furthermore, an inverter is provided, which comprises a described circuit module. An inverter serves to convert a DC voltage, for example from a battery, to an AC voltage, for example for supplying an electric drive with power. An inverter, which comprises a temperature-dependent actuation system of a first switching element, is advantageously provided.

Furthermore, an electric drivetrain is provided, which comprises a described inverter and an electric machine. An electric drivetrain having a temperature-dependent actuation system of a first switching element is advantageously provided for supplying the connected electric machine with AC voltage.

Furthermore, the invention relates to the use of a circuit arrangement for the temperature-dependent actuation of a first switching element in a motor vehicle. In particular, the invention also relates to the use of a described circuit module, a described inverter or an electric drivetrain.

It goes without saying that the features, properties and advantages of the circuit arrangement according to the invention apply or can be applied correspondingly to the circuit module or the inverter, the electric drivetrain and for the use thereof and vice versa.

Further features and advantages of embodiments of the inventions emerge from the following description in relation to the appended drawings.

BRIEF DESCRIPTION OF THE DRAWINGS

The invention is intended to be explained in more detail below with reference to some figures, in which.

DETAILED DESCRIPTION

Figure 1:
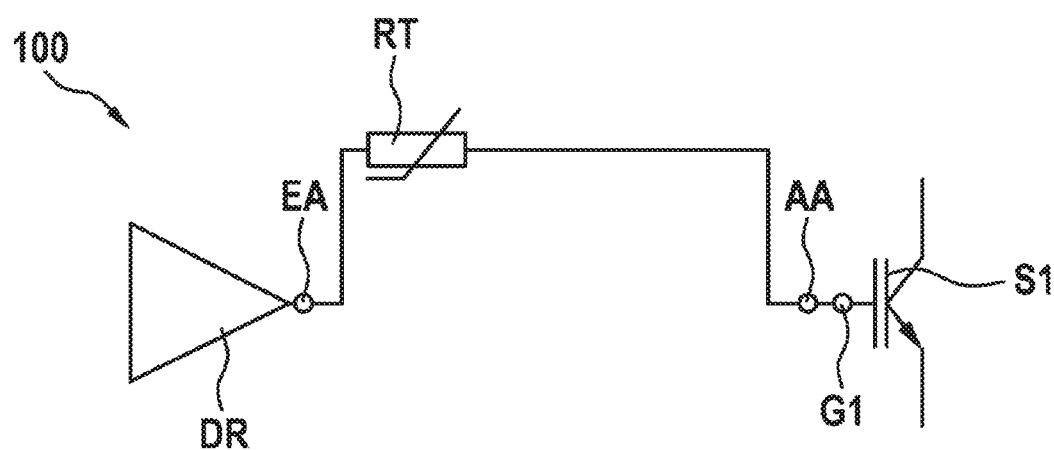
FIG. 1 shows a circuit arrangement for the temperature-dependent actuation of a first switching element.

FIG. 1 shows a circuit arrangement 100, comprising an input connection EA, an output connection AA and a temperature-dependent component RT. A temperature-dependent resistor is illustrated as the temperature-dependent component RT, for example, which is arranged between the input connection EA and the output connection AA. The circuit arrangement serves for temperature-dependent actuation of a first switching element S1, the control connection G1 of which can be connected to the output connection AA. The input connection EA of the circuit arrangement 100 can be connected to the output of a driver circuit DR for receiving an input potential generated by the driver circuit DR. To reduce the effective total series resistance of the circuit arrangement 100 in the event of increasing temperatures, one solution is to use a resistor having a negative temperature coefficient (NTC) as the temperature-dependent resistor RT. In this configuration, the effective total series resistance of the circuit arrangement 100 reduces continuously in accordance with the characteristic curve of the temperature-dependent resistor RT.

Figure 2:
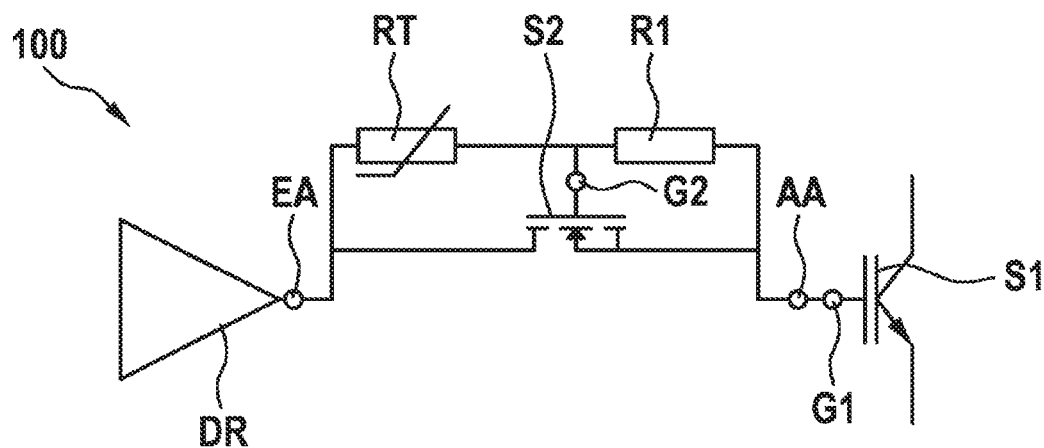
FIG. 2 shows a first alternative of the circuit arrangement for the temperature-dependent actuation.

In accordance with FIG. 2, the circuit arrangement 100 further comprises a second switching element S2. The second switching element S2 is likewise connected between the input connection EA and the output connection AA. The circuit arrangement 100 further comprises a first resistor R1, which is connected in series with the temperature-dependent resistor RT between the input connection EA and the output connection AA. A center tap between the first resistor R1 and the temperature-dependent resistor RT is connected to the second control connection G2 of the second switching element S2. The first resistor R1 and the temperature-dependent resistor RT together form a voltage divider. The temperature at which the second switching element S2 switches on account of the control voltage applied at the second control connection G2 of the second switching element S2 can be set depending on the magnitude of the first resistance R1. In accordance with this configuration, the second switching element S2 becomes conducting when the resistance value of the temperature-dependent resistor RT has fallen below a specific value on account of increasing temperatures and therefore the control voltage at the second control connection G2 is high enough to close the second switching element S2. The second switching element S2 can be embodied as a MOSFET, in particular as an n-channel MOSFET, for example. Said switching element can be operated both in its analog operation, also referred to as amplifier operation, with lesser analog control voltage changes of the control connection G2 or in switching operation with correspondingly great control voltage changes at the control connection G2.

Figure 3:
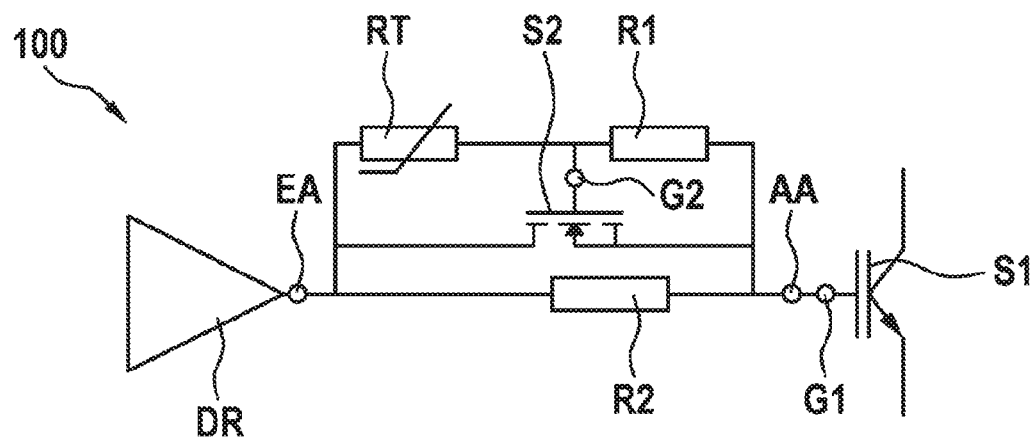
FIG. 3 shows a second alternative of the circuit arrangement for the temperature-dependent actuation.

In accordance with FIG. 3, the circuit arrangement 100 comprises a second resistor R2, which is likewise connected between the input connection EA and the output connection AA. In accordance with this configuration, a second resistance R2 acting in a temperature-independent manner is prescribed by means of the second resistor R2, the switching behavior of the first switching element S1 being able to be set by means of the magnitude of said second resistance. As the temperature increases, the resistance of the temperature-dependent resistor RT decreases again. The control voltage at the control connection G2 of the second switching element S2 increases accordingly. When the control voltage has exceeded a threshold value, the second switching element S2 closes and makes it possible for a current to flow in parallel with the second resistor R2 through the second switching element S2. The effective total series resistance of the circuit arrangement 100 is reduced in the process. Conversely, the control voltage at the control connection G2 of the second switching element S2 decreases as the temperature decreases. When the control voltage has fallen below a threshold value, the second switching element S2 opens and prevents a flow of current in parallel with the second resistor R2. The effective total series resistance of the circuit arrangement 100 increases in the process.

Figure 4:
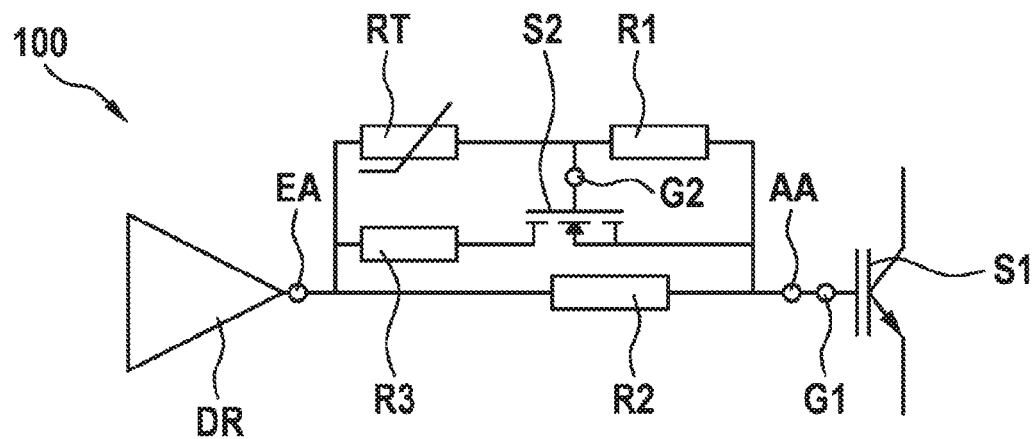
FIG. 4 shows a third alternative of the circuit arrangement for the temperature-dependent actuation.

The circuit arrangement in accordance with FIG. 4 further comprises a third resistor R3, which is connected between the input connection EA and the second switching element S2. By means of dimensioning the third resistor R3, the switching behavior of the first switching element S1 is set for the case in which a flow of current through the second switching element S2 is possible on account of increased temperatures at the temperature-dependent resistor RT.

Figure 5:
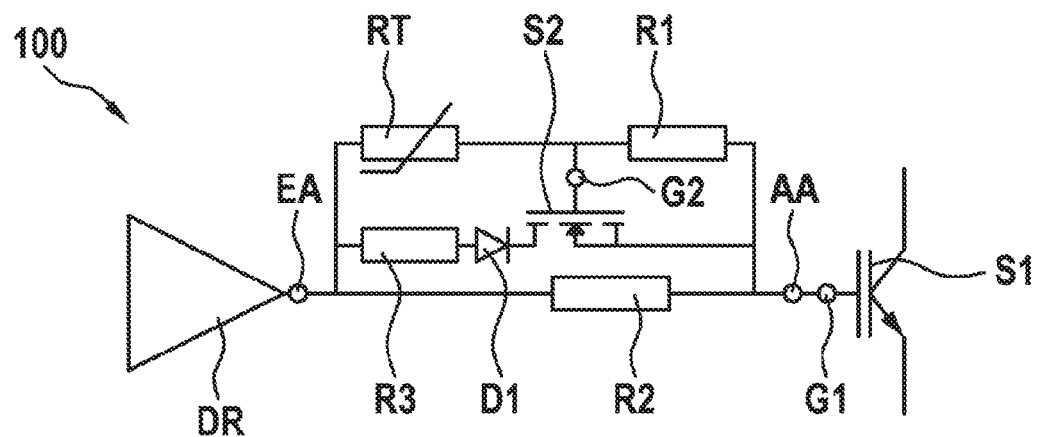
FIG. 5 shows a fourth alternative of the circuit arrangement for the temperature-dependent actuation.

The circuit arrangement in accordance with FIG. 5 further comprises a first diode D1, which is arranged between the second switching element S2 and the third resistor R3. The diode D1 is oriented in such a way that a flow of current from the second switching element S2 in the direction of the third resistor R3 is not possible.

Figure 6:
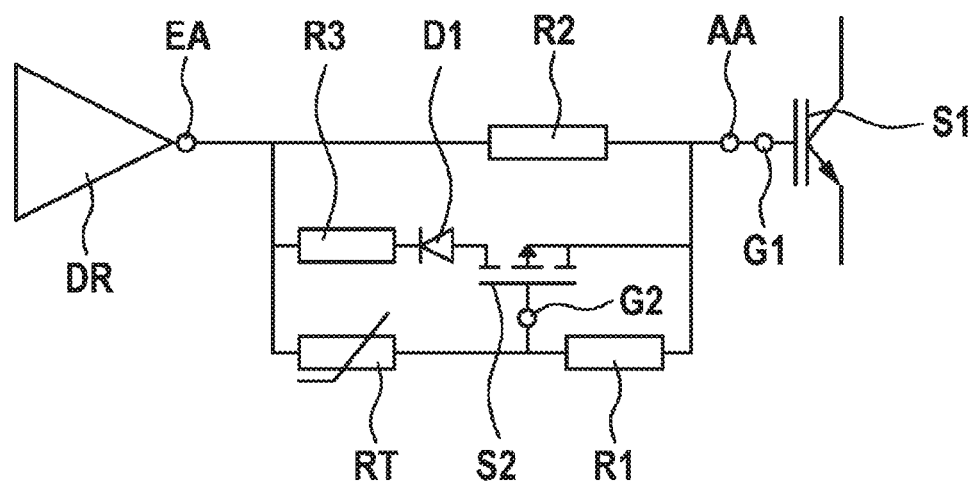
FIG. 6 shows a fifth alternative of the circuit arrangement for the temperature-dependent actuation.

The illustrated embodiments for the switch-on process of the first switching element S1 also apply analogously to the switch-off process of the first switching element S1. A circuit arrangement 100 in accordance with FIG. 6 is therefore provided specifically for the switch-off process, said circuit arrangement essentially being designed in a complementary manner to the previously described circuit arrangements 100. The circuit arrangement 100 likewise has a temperature-dependent component RT, in particular a temperature-dependent resistor. Said temperature-dependent resistor is connected, in particular, in series with a first resistor R1 between the input and the output connection EA, AA. A second switching element S2 is connected in parallel with this series circuit, the second control connection G2 of said second switching element being connected to the center tap of the voltage divider composed of the temperature-dependent resistor RT and the first resistor R1. In particular, a third resistor R3 and/or a first diode D1 is connected between the input connection EA and the second switching element S2, which, in particular, is a p-channel MOSFET. The first diode D1 is in this case oriented in such a way that a flow of current from the third resistor R3 in the direction of the second switching element S2 is not possible. A second resistor R2 can in turn optionally be connected in parallel with the described components between the input connection EA and the output connection AA.

It goes without saying that the illustrated embodiments for the switch-on process and for the switch-off process can be combined, that is to say particularly the complementary circuits according to FIG. 5 and FIG. 6 can be used together to actuate the first switching element S1.

Figure 7:
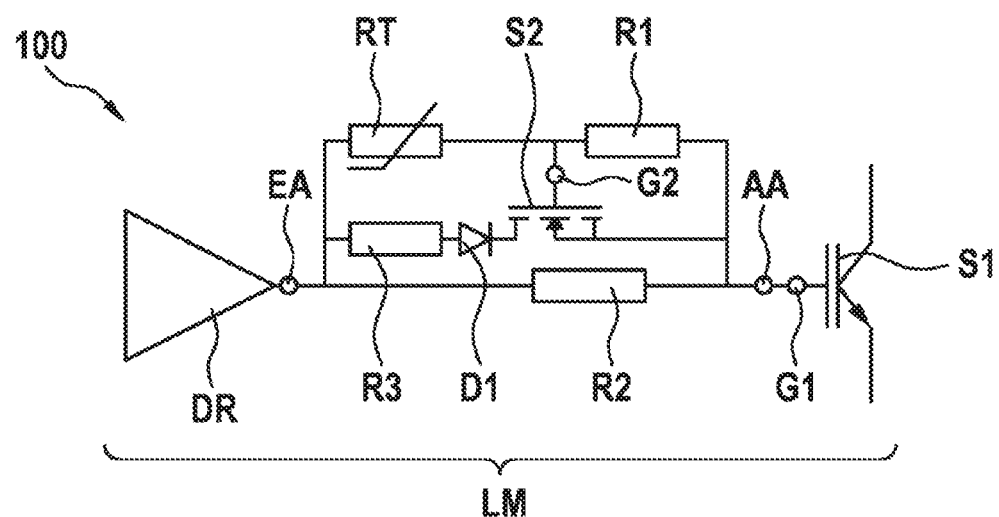
FIG. 7 shows a circuit module comprising temperature-dependent actuation.

In accordance with FIG. 7, a circuit module LM is illustrated, consisting of the circuit arrangement 100 and the switching element S1. In an alternative form of configuration, the circuit module LM also comprises the driver circuit DR.

Figure 8:
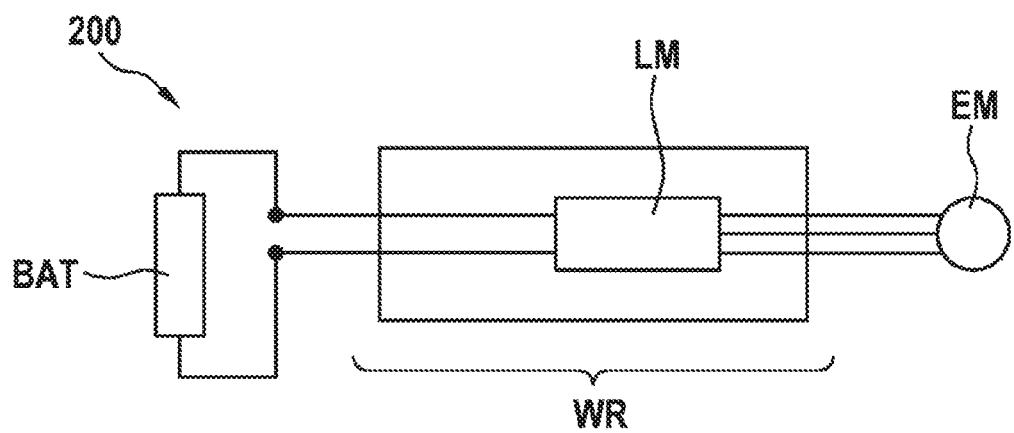
FIG. 8 shows a schematic illustration of an electric drivetrain.

FIG. 8 illustrates an electric drivetrain 200. The electric drivetrain 200 comprises an electric machine EM and an inverter WR, which in turn comprises at least one circuit module LM, in particular a plurality of suitably arranged circuit modules LM. An electric drivetrain 200 of this kind is fed, for example, by means of a battery BAT. This electrical energy source serves for supplying energy to the electric machine EM.

The invention claimed is:

1. A circuit arrangement for the temperature-dependent actuation of a first switching element, the current arrangement comprising:

an input connection for receiving an input potential, an output connection for transferring an output potential to a first control connection of the first switching element, a temperature-dependent component, a second switching element, and a first resistor;

wherein the first resistor is connected in series with the temperature-dependent component between the input connection and the output connection, the second switching element between the input connection and the output connection, and the second control connection of the second switching element is connected to the center tap between the first resistor and the temperature-dependent component, and the temperature-dependent component is connected between the input connection and the output connection.

2. The circuit arrangement as claimed in claim 1, further comprising a second resistor, wherein the second resistor is connected between the input connection and the output connection.

3. The circuit arrangement as claimed in claim 1, further comprising a third resistor, wherein the third resistor is connected between the input connection and the source contact of the second switching element.

4. The circuit arrangement as claimed in claim 3, further comprising a first diode, wherein the first diode is connected between the third resistor and the source contact of the second switching element and prevents a flow of current from the diode in the direction of the third resistor.

5. The circuit arrangement as claimed in claim 3, further comprising a first diode, wherein the first diode is connected between the third resistor and the source contact of the second switching element and prevents a flow of current from the third resistor in the direction of the second switching element.

6. A circuit module comprising a circuit arrangement for the temperature-dependent actuation of a first switching element as claimed in claim 1 and comprising the first switching element connected to the output connection.

7. The circuit module as claimed in claim 6, further comprising a driver circuit connected to the input connection.

8. An inverter (WR), comprising a circuit module comprising:

an input connection for receiving an input potential, an output connection for transferring an output potential to a first control connection of the first switching element, a temperature-dependent component, a second switching element, and a first resistor;

wherein the first resistor is connected in series with the temperature-dependent component between the input connection and the output connection, the second switching element is connected between the input connection and the output connection and the second control connection of the second switching element is connected to the center tap between the first resistor and the temperature-dependent component, and the temperature-dependent component is connected between the input connection and the output connection, and the first switching element is connected to the output connection.

9. An electric drivetrain, comprising:

an input connection for receiving an input potential, an output connection for transferring an output potential to a first control connection of the first switching element, a temperature-dependent component, a second switching element, and a first resistor;

wherein the first resistor is connected in series with the temperature-dependent component between the input connection and the output connection, the second switching element is connected between the input connection and the output connection, and the second control connection of the second switching element is connected to the center tap between the first resistor and the temperature-dependent component, and the temperature-dependent component is connected between the input connection and the output connection, and the first switching element is connected to the output connection; and an electric machine (EM).

* * * * *